United States Patent
Osotio

(10) Patent No.: US 10,824,638 B2
(45) Date of Patent: Nov. 3, 2020

(54) ENHANCING OBJECT REPRESENTATIONS USING INFERRED USER INTENTS

(71) Applicant: MICROSOFT TECHNOLOGY LICENSING, LLC, Redmond, WA (US)

(72) Inventor: Neal Timothy Osotio, Sammamish, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 339 days.

(21) Appl. No.: 15/081,383

(22) Filed: Mar. 25, 2016

(65) Prior Publication Data
US 2017/0277764 A1    Sep. 28, 2017

(51) Int. Cl.
| | |
|---|---|
| *G06T 19/20* | (2011.01) |
| *G06F 16/26* | (2019.01) |
| *G06F 16/248* | (2019.01) |
| *G06F 30/13* | (2020.01) |
| *G06F 3/01* | (2006.01) |

(Continued)

(52) U.S. Cl.
CPC .............. *G06F 16/26* (2019.01); *G06F 3/011* (2013.01); *G06F 16/248* (2019.01); *G06F 30/13* (2020.01); *G06T 5/00* (2013.01); *G06T 19/006* (2013.01); *G06T 19/20* (2013.01); *G06T 2200/04* (2013.01); *G06T 2207/20172* (2013.01)

(58) Field of Classification Search
CPC .. G06F 17/30572; G06F 16/248; G06F 16/26; G06F 30/13; G06F 3/011; G06F 17/30; G06F 3/01; G06T 19/006; G06T 2207/20172; G06T 2200/04; G06T 5/00; G06T 19/20; G06T 19/00
USPC ........................................................ 707/776
See application file for complete search history.

(56) References Cited

U.S. PATENT DOCUMENTS

| | | | |
|---|---|---|---|
| 5,737,533 A | 4/1998 | de Hond | |
| 8,645,413 B2 | 2/2014 | Betzler et al. | |

(Continued)

FOREIGN PATENT DOCUMENTS

| | | |
|---|---|---|
| GB | 2406180 A | 3/2005 |
| WO | 0021039 A1 | 4/2000 |

OTHER PUBLICATIONS

Pascoal, et al., "Towards an Immersive Interface for 3D Object Retrieval", In Proceedings of Eurographics Workshop on 3D Object Retrieval, May 13, 2012, 5 pages.

(Continued)

*Primary Examiner* — Hicham Skhoun
(74) *Attorney, Agent, or Firm* — Shook, Hardy and Bacon, L.L.P.

(57) ABSTRACT

Systems, methods and computer storage media for enhancing object representations using data items selected based upon inferred user intents are provided. Information indicative of an initial object representation is received. At least one user intent related to the initial object representation is inferred based upon one or more of a plurality of artifacts related to the user and/or the user's activities. Based upon the inferred user intent and the initial object representation, one or more data items are determined that are relevant to the both the intent and the representation. The determined data items are mapped to the initial object representation to create an enhanced object representation.

20 Claims, 11 Drawing Sheets

(51) Int. Cl.
*G06T 5/00* (2006.01)
*G06T 19/00* (2011.01)

(56) References Cited

U.S. PATENT DOCUMENTS

| | | | | |
|---|---|---|---|---|
| 9,298,884 | B1* | 3/2016 | Ahmad | G06F 19/3418 |
| 9,383,895 | B1* | 7/2016 | Vinayak | G06F 3/017 |
| 2004/0249809 | A1* | 12/2004 | Ramani | G06F 17/30259 |
| 2007/0130112 | A1* | 6/2007 | Lin | G06F 17/3002 |
| 2010/0153428 | A1* | 6/2010 | Schechter | G06F 16/9535 |
| | | | | 707/768 |
| 2011/0055203 | A1* | 3/2011 | Gutt | G06F 17/30274 |
| | | | | 707/722 |
| 2012/0158370 | A1 | 6/2012 | Logatoc | |
| 2013/0097197 | A1 | 4/2013 | Rincover et al. | |
| 2015/0169636 | A1 | 6/2015 | Ovsjanikovs et al. | |
| 2015/0186418 | A1 | 7/2015 | Harp et al. | |
| 2016/0350953 | A1* | 12/2016 | Mittelstaedt | G06T 11/60 |

OTHER PUBLICATIONS

Walczak, et al., "Meta-VR: A Dynamic Approach to Building Interactive 3D Web Applications", In International Journal of Human Computer Interaction, Jul. 2004, 10 pages.

Fisher, et al., "Context based Search for 3D models", In Journal of ACM Transactions on Graphics, vol. 29, Issue 6, Dec. 2010, 10 pages.

Franzen, Carl, "This Search Engine shows you 3D Models of Everything", Published on: Aug. 8, 2014 Available at: http://www.theverge.com/2014/8/8/5982355/yobi3d-is-a-search-engine-for-3d-models.

Funkhouser, et al., "A Search Engine for 3D Models", In Proceedings of ACM Transactions on Graphics, vol. 22, Issue 1, Jan. 2003, pp. 1-28.

Hou, et al., "Dynamic Query Interface for 3d Shape Search", In Proceedings of ASME Design Engineering Technical Conferences and Computers and Information in Engineering Conference, Sep. 28, 2004, pp. 1-9.

Min, et al., "Early Experiences with a 3D Model Search Engine", In Proceeding of the Eighth International Conference on 3D Web Technology, Mar. 9, 2003, 12 pages.

Grindle, Charles E., "Adaptive 3D Web Sites Summary", Retrieved on: Nov. 6, 2015 Available at: www.pitt.edu/~peterb/3954-061/Adaptive_3D_web_core_Summary.doc.

Duncan, Greg, "Researching with HoloLens (and be awarded Dev Kits and Cash)", Published on: Jul. 14, 2015 Available at: https://channel9.msdn.com/coding4fun/kinect/Researching-with-HoloLens.

Koutsoudis, et al., "3DSSE—A 3D Scene Search Engine: Exploring 3D scenes using keywords", In Journal of Cultural Heritage, vol. 13, Issue 2, Apr. 2012, 14 pages.

"International Search Report and Written Opinion Issued in PCT Application No. PCT/US2017/023270", dated May 4, 2017, 9 Pages.

* cited by examiner

ENHANCING OBJECT REPRESENTATIONS USING INFERRED USER INTENTS

BACKGROUND

Presently, much of the information accessible on the Internet, for instance, search-related information collected and maintained by companies such as Microsoft® Corporation, Google® Inc. and Facebook®, Inc., is viewable primarily in two dimensions. This is because current technology accessible to users to view information (e.g., desktop computers, mobile devices, consoles, and the like) primarily renders the information in two dimensions. More recently, products (e.g., virtual reality products) that are capable of rendering data in three dimensions have been introduced to the consumer market. However, the ability to combine information (such as search-related information) with the three-dimensional capabilities of this viewing technology such that the information may be viewed and manipulated in three-dimensions remains lacking.

SUMMARY

This Summary is provided to introduce a selection of concepts in a simplified form that are further described below in the Detailed Description. This Summary is not intended to identify key features or essential features of the claimed subject matter, nor is it intended to be used in isolation as an aid in determining the scope of the claimed subject matter.

In various embodiments, systems, methods, and computer storage media are provided for enhancing object representations using data items selected based upon inferred user intents. Information indicative of an initial object representation is received. Such information may be received, by way of example, as a three-dimensional representation, a two-dimensional representation, or a text-based description. At least one user intent related to the initial object representation is inferred based upon one or more artifacts related to the user and/or the user's activities. Such artifacts may include, by way of example and not limitation, search query data (e.g., search query content, search query session duration, a quantity of repeat search queries, and a quantity of related search queries), data items saved by the user, data items posted by the user, data items shared by the user, web sites or web pages visited by the user, a quantity of visits to certain web sites or web pages by the user, an amount of time the user lingers on particular web sites or web pages, an amount of time the user lingers on a particular item (determined, for instance, using head and/or eye-tracking technology), user-stated preferences, user-inferred preferences, and prior user behavior. Based upon the inferred user intent and the initial object representation, one or more data items are determined that are relevant to the both the inferred intent and the object representation. The determined data items are mapped to the initial object representation to create an enhanced object representation. In exemplary embodiments, data items are determined by mining search-related information.

Embodiments hereof provide for enhancing object representations using data items selected based on inferred user intents. Such enhancement quickly and efficiently provides an intelligent estimation of an object representation the user likely intends to create. The intelligent estimation additionally is able to provide information and details of which the user may not otherwise be aware that can improve the quality of the resultant enhanced object representation.

BRIEF DESCRIPTION OF THE DRAWINGS

The present technology is illustrated by way of example and not limitation in the accompanying figures in which like reference numerals indicate similar elements and in which.

DETAILED DESCRIPTION

Figure 1:
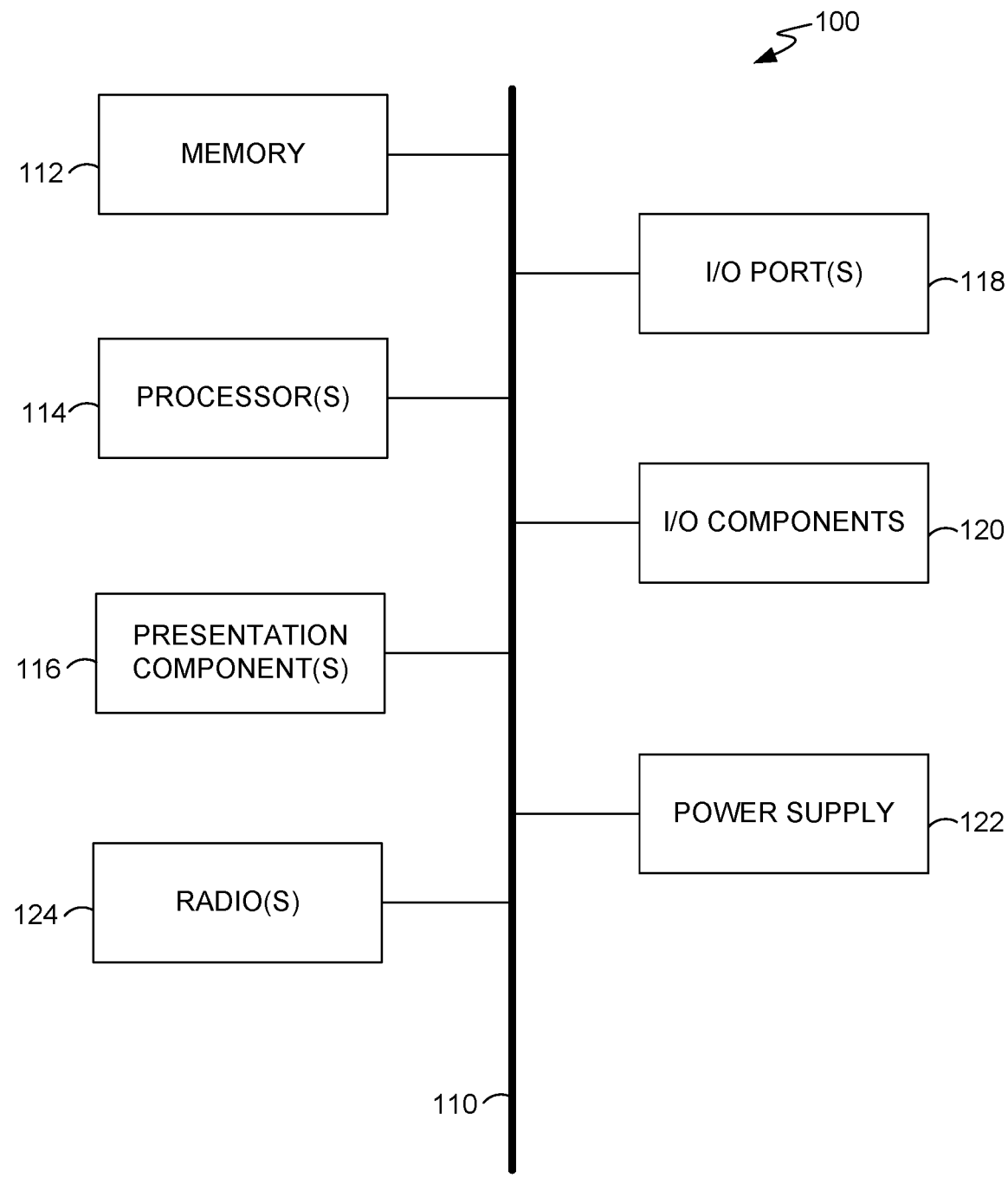
FIG. 1 is a block diagram of an exemplary computing environment suitable for implementing aspects of the technology described herein.

The technology of the present application is described with specificity herein to meet statutory requirements. However, the description itself is not intended to limit the scope of this patent. Rather, the inventor has contemplated that the claimed subject matter might also be embodied in other ways, to include different steps or combinations of steps similar to the ones described in this document, in conjunction with other present or future technologies. Moreover, although the terms "step" and/or "block" may be used herein to connote different elements of methods employed, the terms should not be interpreted as implying any particular order among or between various steps herein disclosed unless and except when the order of individual steps is explicitly described.

Various aspects of the technology described herein are generally directed to systems, methods, and computer storage media for enhancing object representations using data items determined based upon inferred user intents. An "object representation," as the term is utilized herein, refers to an electronic rendering that approximates an actual or imagined real world object in a plurality of qualities (e.g., shape, color, dimension, proportion, and the like) that make the representation visually appear like an image of a real world object. In accordance with embodiments hereof, information indicative of an initial object representation is received from a user. Such information may be received, by way of example only, as a three-dimensional representation (for instance, a three-dimensional model), as a two-dimensional representation (for instance, a sketch, drawing or photograph), or as a text-based description (for instance, received by alphanumeric input, audio input, or gestural input). In exemplary embodiments, a hologram (i.e., an object representation that is produced by a split laser beam and that appears to be three-dimensional) representing an object is received.

At least one user intent related to the initial object representation is inferred based upon one or more of a plurality of artifacts related to a user and/or the user's activities. Such artifacts may include, by way of example and not limitation, search query data (e.g., search query content, search query session duration, a quantity of repeat search queries, and a quantity of related search queries), data items saved by the user, data items posted by the user, data items shared by the user, web sites or web pages visited by the user, a quantity of visits to certain web sites or web pages by the user, an amount of time the user lingers on a particular web site or web page, an amount of time the user lingers on a particular item (determined, for instance, using head and/or eye-tracking technology), user-stated preferences, user-inferred preferences, and prior user behavior.

Based upon the inferred user intent and the initial object representation, one or more data items are determined that are relevant to the both the inferred intent and the initial object representation. "Data items," as the term is utilized herein, may include any information accessible to a system configured in accordance with the present technology. For instance, data items may include information accessible via the Internet, information locally stored on a computing device associated with the user, information stored in a data store accessible by the user's computing device, and the like. In exemplary embodiments, data items are determined by mining search-related information, for instance, search-related information collected and maintained by companies such as Microsoft® Corporation, Google® Inc., and Facebook®, Inc. Data mining techniques are known to those having ordinary skill in the art and, accordingly, are not further described herein.

Data items determined relevant to the inferred intent and the initial object representation are mapped to the initial object representation to create an enhanced object representation that includes information (visual and otherwise) associated with the determined data items. Mapping data items to an object representation may include, by way of example and not limitation, altering one or more visual characteristics of the initial object representation and/or tagging or otherwise appending relevant information to the initial object representation to create the enhanced object representation. In embodiments, three-dimensional representations of information otherwise stored in two-dimensions may be created prior to mapping the information to the initial object representation Enhanced object representations created in accordance with the systems and methods of the present technology provide intelligent estimations of object representations the user likely intends to create.

Accordingly, exemplary embodiments are directed to computing devices having at least one processor and memory having computer-executable instructions stored thereon that, when executed by the at least one processor, configure the computing device to perform certain functions. Such exemplary functions may include receiving information indicative of an object representation; determining an intent of a user, the user intent being related to the object representation; determining one or more data items relevant to the user intent and to the object representation; and enhancing the object representation with at least a portion of the one or more data items to create an enhanced object representation.

Other exemplary embodiments are directed to methods (for instance, being performed by one or more computing devices including at least one processor) for enhancing object representations using inferred user intents. Such exemplary embodiments may include receiving a three-dimensional object representation; determining an intent of a user, the user intent being related to the three-dimensional object representation; determining one or more data items relevant to the user intent and to the three-dimensional object representation; enhancing the three-dimensional object representation with at least a portion of the one or more data items to create an enhanced three-dimensional object representation; and presenting the enhanced three-dimensional object representation.

Yet other exemplary embodiments are directed to one or more computer storage media having computer-executable instructions embodied thereon which, when executed, configure a computing device to perform a method of enhancing object representations using inferred user intents. Such exemplary methods may include receiving information indicative of an object representation; inferring intent of a user related to the object representation; determining one or more data items relevant to the user intent and to the object representation; and creating an enhanced object representation utilizing at least a portion of the one or more data items.

Referring now to the figures in general and initially to FIG. 1 in particular, an exemplary operating environment for implementing embodiments of the present technology is shown and designated generally as computing device 100. The computing device 100 is but one example of a suitable computing environment and is not intended to suggest any limitation as to the scope of use or functionality of embodiments of the technology. Neither should the computing device 100 be interpreted as having any dependency or requirement relating to any one component nor any combination of components illustrated.

Embodiments of the technology may be described in the general context of computer code or machine-useable instructions, including computer-useable or computer-executable instructions such as program modules, being executed by a computer or other machine, such as a personal data assistant or other handheld device. Generally, program modules include routines, programs, objects, components, data structures, and the like, and/or refer to code that performs particular tasks or implements particular abstract data types. Embodiments of the technology may be practiced in a variety of system configurations, including, but not limited to, hand-held devices, consumer electronics, general-purpose computers, more specialty computing devices, and the like. Embodiments of the technology also may be practiced in distributed computing environments where tasks are performed by remote-processing devices that are linked through a communications network.

With continued reference to FIG. 1, the computing device 100 includes a bus 110 that directly or indirectly couples the following devices: a memory 112, one or more processors

114, one or more presentation components 116, one or more input/output (I/O) ports 118, one or more I/O components 120, and an illustrative power supply 122. The bus 110 represents what may be one or more busses (such as an address bus, data bus, or combination thereof). Although the various blocks of FIG. 1 are shown with lines for the sake of clarity, in reality, these blocks represent logical, not necessarily actual, components. For example, one may consider a presentation component such as a display device to be an I/O component. Also, processors have memory. The inventor hereof recognizes that such is the nature of the art, and reiterates that the diagram of FIG. 1 is merely illustrative of an exemplary computing device that can be used in connection with one or more embodiments of the present technology. Distinction is not made between such categories as "workstation," "server," "laptop," "hand-held device," etc., as all are contemplated within the scope of FIG. 1 and reference to "computing device."

The computing device 100 typically includes a variety of computer-readable media. Computer-readable media may be any available media that is accessible by the computing device 100 and includes both volatile and nonvolatile media, removable and non-removable media. Computer-readable media comprises computer storage media and communication media; computer storage media excluding signals per se. Computer storage media includes volatile and nonvolatile, removable and non-removable media implemented in any method or technology for storage of information such as computer-readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by the computing device 100. Communication media, on the other hand, embodies computer-readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer-readable media.

The memory 112 includes computer-storage media in the form of volatile and/or nonvolatile memory. The memory may be removable, non-removable, or a combination thereof. Exemplary hardware devices include solid-state memory, hard drives, optical-disc drives, and the like. The computing device 100 includes one or more processors 114 that read data from various entities such as the memory 112 or the I/O components 120. The presentation component(s) 116 present data indications to a user or other device. Exemplary presentation components include a display device, speaker, printing component, vibrating component, and the like.

The I/O ports 118 allow the computing device 100 to be logically coupled to other devices including the I/O components 120, some of which may be built in. Illustrative I/O components 120 include a microphone, joystick, game pad, satellite dish, scanner, printer, display device, wireless device, a controller (such as a stylus, a keyboard, and a mouse), a natural user interface (NUI), and the like. In aspects, a pen digitizer (not shown) and accompanying input instrument (also not shown but which may include, by way of example only, a pen or a stylus) are provided in order to digitally capture freehand user input. The connection between the pen digitizer and processor(s) 114 may be direct or via a coupling utilizing a serial port, parallel port, and/or other interface and/or system bus known in the art. Furthermore, the digitizer input component may be a component separate from an output component such as a display device, or in some aspects, the usable input area of a digitizer may coexist with the display area of a display device, be integrated with the display device, or may exist as a separate device overlaying or otherwise appended to a display device. Any and all such variations, and any combination thereof, are contemplated to be within the scope of aspects of the technology described herein.

An NUI processes air gestures, voice, or other physiological inputs generated by a user. Appropriate NUI inputs may be interpreted as ink strokes for presentation in association with the computing device 100. These requests may be transmitted to the appropriate network element for further processing. An NUI implements any combination of speech recognition, touch and stylus recognition, facial recognition, biometric recognition, gesture recognition both on screen and adjacent to the screen, air gestures, head and eye tracking, and touch recognition associated with displays on the computing device 100. The computing device 100 may be equipped with depth cameras, such as stereoscopic camera systems, infrared camera systems, RGB camera systems, and combinations of these, for gesture detection and recognition. Additionally, the computing device 100 may be equipped with accelerometers or gyroscopes that enable detection of motion. The output of the accelerometers or gyroscopes may be provided to the display of the computing device 100 to render immersive augmented reality or virtual reality. By way of example, the computing device 100 may include Hololens® technology, offered by Microsoft® Corporation of Redmond, Wash. Hololens® is a fully untethered, see-through holographic computer that enables high-definition holograms to come to life in the user's world, seamlessly integrating the user's physical places, spaces, and things. The resultant experience is a form of immersive augmented reality generally referred to as "mixed reality."

The computing device 100 additionally may include a radio 124. The radio 124 transmits and receives radio communications. The computing device 100 may be a wireless terminal adapted to receive communications and media over various wireless networks. The computing device 100 may communicate via wireless protocols, such as code division multiple access ("CDMA"), global system for mobiles ("GSM"), or time division multiple access ("TDMA"), as well as others, to communicate with other devices. The radio communications may be a short-range connection, a long-range connection, or a combination of both a short-range and a long-range wireless telecommunications connection. When referring to "short" and "long" types of connections herein, reference to the spatial relation between two devices is not intended. Instead, short range and long range are generally being referred to as different categories, or types, of connections (i.e., a primary connection and a secondary connection). A short-range connection may include a WiFi® connection to a device (e.g., a mobile hotspot) that provides access to a wireless communications network, such as a WLAN connection using the 802.11 protocol. A Bluetooth® connection to another computing device is a second example of a short-range connection. A long-range connection may include a connection using one or more of CDMA, GPRS, GSM, TDMA, and 802.16 protocols.

Aspects of the subject matter detailed herein may be described in the general context of computer-executable instructions, such as program modules, being executed by an electronic device. Generally, program modules include routines, programs, objects, components, data structures, and so forth, which perform particular tasks or implement particular abstract data types. Aspects of the subject matter described herein also may be practiced in distributed computing environments where tasks are performed by remote processing devices that are linked through a communications network. In a distributed computing environment, program modules may be located in both local and remote computer storage media including memory storage devices. The computer-useable instructions form an interface to allow a computing device to react according to a source of input. The instructions cooperate with other code segments to initiate a variety of tasks in response to data received in conjunction with the source of the received data.

Figure 2:
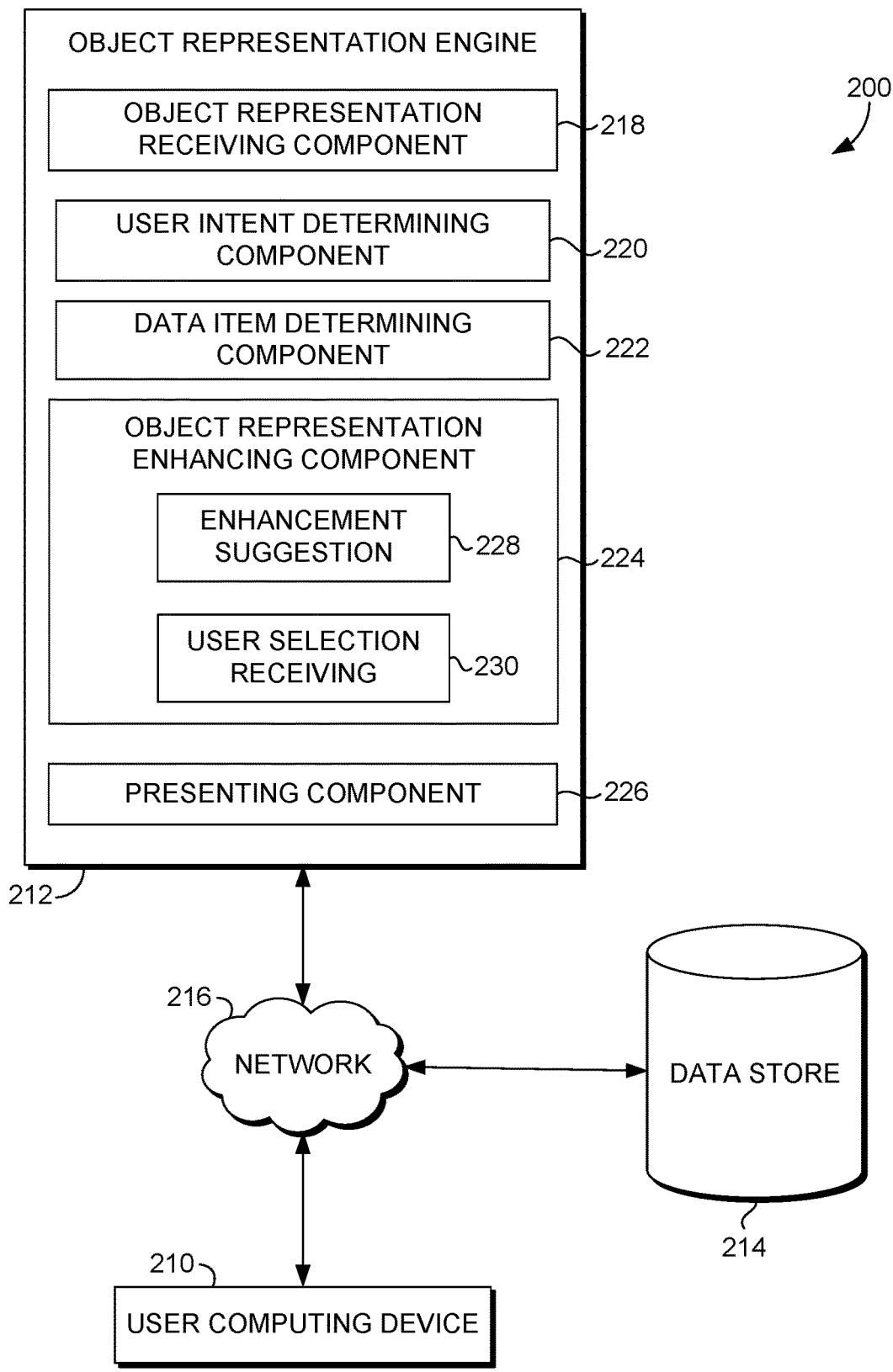
FIG. 2 is a diagram depicting an exemplary computing environment for enhancing object representations using data items determined based upon inferred user intents, in accordance with an aspect of the technology described herein.

As previously set forth, embodiments of the present technology generally are directed to systems, methods, and computer storage media for enhancing object representations using data items determined based upon inferred user intents. With reference to FIG. 2, a block diagram is provided illustrating an exemplary computing system 200 in which embodiments of the present technology may be employed. Generally, the computing system 200 illustrates an environment in which initial object representations may be enhanced using data items determined based upon user intents, in accordance with the methods, for instance, illustrated in FIGS. 3 and 4 (more fully described below). Among other components not shown, the computing system 200 generally includes a user computing device 210, an object representation engine 212, and a data store 214, all in communication with one another via a network 216. The network 216 may include, without limitation, one or more local area networks (LANs) and/or wide area networks (WANs). Such networking environments are commonplace in offices, enterprise-wide computer networks, intranets and the Internet. Accordingly, the network 216 is not further described herein.

It should be understood that any number of user computing devices 210 and/or object representation engines 212 may be employed in the computing system 200 within the scope of embodiments of the present technology. Each may comprise a single device/interface or multiple devices/interfaces cooperating in a distributed environment. For instance, the object representation engine 212 may comprise multiple devices and/or modules arranged in a distributed environment that collectively provide the functionality of the object representation engine 212 described herein. Additionally, other components or modules not shown also may be included within the computing system 200.

In some embodiments, one or more of the illustrated components/modules may be implemented as stand-alone applications. In other embodiments, one or more of the illustrated components/modules may be implemented via the object representation engine 212 or as an Internet-based service. It will be understood by those having ordinary skill in the art that the components/modules illustrated in FIG. 2 are exemplary in nature and in number and should not be construed as limiting. Any number of components/modules may be employed to achieve the desired functionality within the scope of embodiments hereof. Further, components/modules may be located on any number of object representation engines 212. By way of example only, the object representation engine 212 might be provided as a single computing device, a cluster of computing devices, or a computing device remote from one or more of the remaining components.

It should be understood that this and other arrangements described herein are set forth only as examples. Other arrangements and elements (e.g., machines, interfaces, functions, orders, and groupings of functions) can be used in addition to or instead of those shown and/or described, and some elements may be omitted altogether. Further, many of the elements described herein are functional entities that may be implemented as discrete or distributed components or in conjunction with other components, and in any suitable combination and location. Various functions described herein as being performed by one or more entities may be carried out by hardware, firmware, and/or software. For instance, various functions may be carried out by a processor executing instructions stored in memory.

The user computing device 210 may include any type of computing device, such as the computing device 100 described with reference to FIG. 1, for example. Generally, the computing device 110 is associated with a microphone for accepting dictated input and one or more I/O components, such as a stylus or keypad, for permitting alphanumeric and/or textual input into a designated region (e.g., text box). In exemplary embodiments, the computing device 100 includes Hololens® technology, offered by Microsoft® Corporation of Redmond, Wash., Oculus VR® technology, offered by Samsung Electronics, or other virtual-reality technology.

A computing device associated with the object representation engine 212 may include any type of computing device, such as, e.g., the computing device 100 described with reference to FIG. 1. It should be noted that the functionality described herein as being performed by the object representation engine 212 may be performed by any other application, application software, user interface, or the like capable of accepting three-dimensional input (for instance, representations of three-dimensional models), two-dimensional image-based input (for instance, sketches, drawings or photographs), and/or text-based descriptions (for instance, received by alphanumeric input, audio input, or gestural input), as well as being capable of rendering typewritten text and/or images converted from speech input, gestural input, and the like. It should further be noted that embodiments of the present technology are equally applicable to mobile computing devices and devices accepting gesture, touch and/or voice input. Any and all such variations, and any combination thereof, are contemplated to be within the scope of embodiments of the present technology.

The object representation engine 212 of the computing system 200 of FIG. 2 is configured to, among other things, determine user intents and, based on determined user intents, enhance object representations utilizing determined data items. As illustrated, the object representation engine 212 has access to a data store 214. The data store 214 is configured to store information related to, by way of example only, a plurality of artifacts related to the user and/or the user's activities. Such artifacts may include, by way of example and not limitation, search query data (e.g., search query content, search query session duration, a quantity of repeat search queries, and a quantity of related search queries), data items saved by the user, data items posted by the user, data items shared by the user, web sites or web pages visited by the user, a quantity of visits to certain web sites or web pages by the user, an amount of time the user lingers on particular web sites or web pages, an amount of time a user lingers on particular items (determined, for instance, using head and/or eye-tracking technology), user-stated preferences, user-inferred preferences, and prior user behavior. To the extent user behavior patterns and the like that are specific to one or more users are stored in association with the data store 214, such user(s) may be permitted to consent to such data collection, in accordance with embodiments hereof. For instance, prior to collection of user-specific data, notice may be provided informing the user that such data will be collected unless s/he opts out of such collection. Alternatively, the user may be asked to take affirmative action to consent to collection (i.e., to opt-in) before such data is collected. Any and all such variations, and any combination thereof, are contemplated to be within the scope of aspects of the present technology.

The data store 214 further is configured to store data items that may be determined by the object representation engine 212 as relevant to user intents and initial object representations. Such data items may include, by way of example only, information accessible via the Internet, information locally stored on a computing device associated with the user, information stored in a data store accessible by the user's computing device, and the like.

In embodiments, the data store 214 is configured to be searchable for one or more of the items stored in association therewith. It will be understood and appreciated by those having ordinary skill in the art that the information stored in association with the data store 214 may be configurable and may include any information relevant to, by way of example only, artifacts related to the user and/or the user's activities, data items that may be determined relevant to user intents and object representations, existing object representations, user preferences, and the like. The content and volume of such information are not intended to limit the scope of aspects of the present technology in any way. Further, the data store 214 may be a single, independent component (as shown) or a plurality of storage devices, for instance a database cluster, portions of which may reside in association with the object representation engine 212, another external computing device (not shown), and/or any combination thereof. Additionally, the data store 214 may include a plurality of unrelated data stores within the scope of embodiments of the present technology.

As illustrated, the object representation engine 212 includes an object representation receiving component 218, a user intent determining component 220, a data item determining component 222, an object representation enhancing component 224, and a presenting component 226. The object representation receiving component 218 is configured to, among other things, receive information indicative of an initial object representation. Such information may be received, by way of example only, by the object representation receiving component 218 as a three-dimensional representation (for instance, a three-dimensional model), as a two-dimensional image-based representation (for instance, a sketch, drawing or photograph), or as a text-based description (for instance, received via alphanumeric input, audio input, or gestural input). In exemplary embodiments, a hologram representing an object is received as information indicative of an initial object representation, for instance, when a user computing device 210 from which the information is received incorporates Hololens®, Oculus VR®, or other virtual-reality technology.

The user intent determining component 220 is configured to, among other things, determine or infer at least one user intent related to the initial object representation based upon one or more of a plurality of artifacts related to a user and/or the user's activities. Such artifacts may include, by way of example and not limitation, search query data (e.g., search query content, search query session duration, a quantity of repeat search queries, and a quantity of related search queries), data items saved by the user, data items posted by the user (for instance to a wall of a social media website), data items shared by the user (via email, text, etc.), web sites or web pages visited by the user, a quantity of visits to certain web sites or web pages by the user, an amount of time the user lingers on a particular web site or web page, an amount of time the user lingers on a particular item (determined, for instance, using head and/or eye-tracking technology), user-stated preferences, user-inferred preferences, and prior user behavior. User intent may also be inferred from collaborative information from previous social interactions that the user had. For instance, suppose an Architect was having a conversation (IM, email, or through other productivity applications) with her colleagues around certain aspects of a project they are working on, a particular new innovative material, or how best to solve a structure issue, etc. (a collaborative "mindshare"). That collaborative information can be used to hone in on user intent.

Based upon the inferred user intent and the initial object representation, the data item determining component 222 is configured to, among other things, determine one or more data items that are relevant to the both the inferred intent and the initial object representation. Such data items may include, by way of example and not limitation, information accessible via the Internet, information locally stored on the user computing device 210, information stored in a data store (e.g., data store 214) accessible by the user computing device 210, and the like. In exemplary embodiments, data items are determined by mining search-related information, for instance, search-related information collected and maintained by companies such as Microsoft® Corporation, Google® Inc., and Facebook®, Inc.

The object representation enhancing component 224 is configured to, among other things, map data items determined relevant to the inferred intent and the initial object representation to the initial object representation to create an enhanced object representation that includes information (visual and otherwise) associated with the determined data items. Mapping data items to an object representation may include, by way of example and not limitation, altering one or more visual characteristics of the initial object representation and/or tagging or otherwise appending relevant information to the initial object representation to create the enhanced object representation. In embodiments, three-dimensional representations of information otherwise stored in two-dimensions may be created prior to mapping the information to the initial object representation Enhanced object representations created in accordance with the systems and methods of the present technology provide intelligent estimations of object representations the user likely intends to create In embodiments, the object representation enhancing component 224 is configured to provide suggested enhancements, for instance, enhancements that will be incorporated into an initial object representation upon review and affirmative action taken by the user. Accordingly, as illustrated, the object representation enhancing component 224 includes an enhancement selecting component 228 and a user selection receiving component 230. The enhancement suggestion component 228 is configured to, among other things, provide the user with one or more suggested enhancements that may be incorporated into the initial object representation. The user selection receiving component 230 is configured to, among other things, receive a selection by the user of one or more enhancements suggested by the enhancement suggestion component 228. Means of providing selectable options to a user and for receiving affirmative input based on selected items are known to those having ordinary skill in the art and, accordingly, are not further described herein.

The presenting component 226 of the object representation engine 212 is configured to, among other things, transmit enhanced object representations to the user computing device 210 for rendering in association therewith. Means for presenting (visually and otherwise) are known to those having ordinary skill in the art and, accordingly, are not further described herein.

Figure 3:
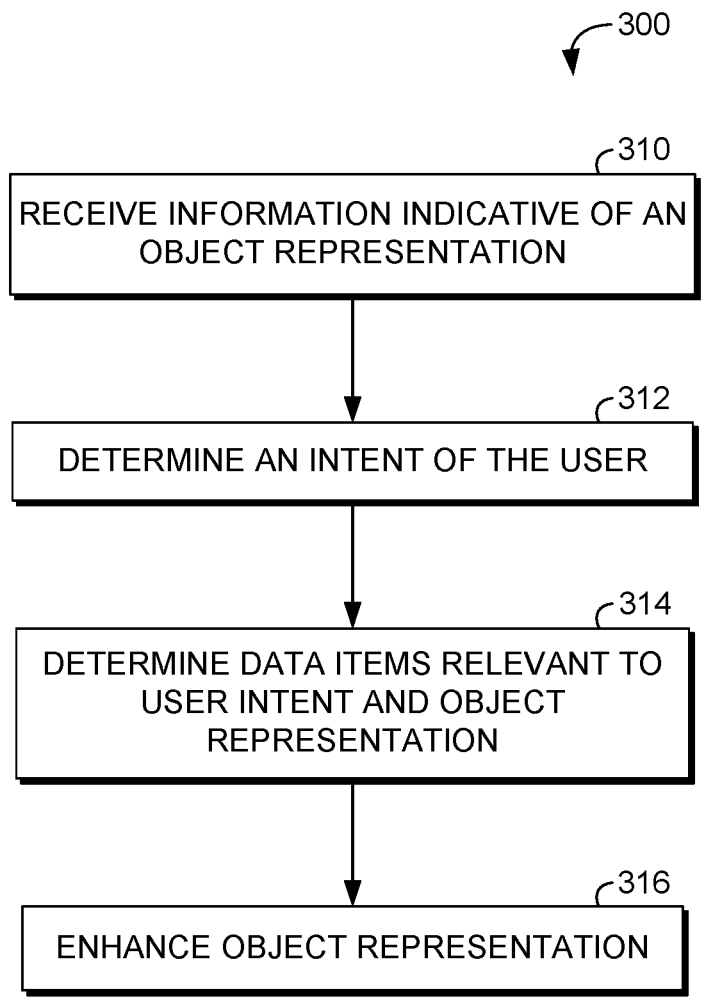
FIG. 3 is a flow diagram depicting a method for enhancing object representations using data items determined based upon inferred user intents, in accordance with an aspect of the technology described herein.

Turning now to FIG. 3, a flow diagram is illustrated showing an exemplary method 300 for enhancing object representations using data items determined based upon inferred user intents. As indicated at block 310, information indicative of an object representation is received, e.g., by the object representation receiving component 218 of the object representation engine 212 of FIG. 2. As indicated at block 312, an intent of a user is determined, for instance, by the user intent determining component 220 of the object representation engine 212 of FIG. 2. The user intent is related to the received object representation. As indicated at block 314, one or more data items relevant to the user intent and to the object representation are determined, e.g., by the data item determining component 222 of the object representation engine 212 of FIG. 2. As indicated at a block 216, the object representation is enhanced with at least a portion of the one or more data items to create an enhanced object representation. This is accomplished, for instance, utilizing the object representation enhancing component 224 of the object representation engine 212 of FIG. 2.

Figure 4:
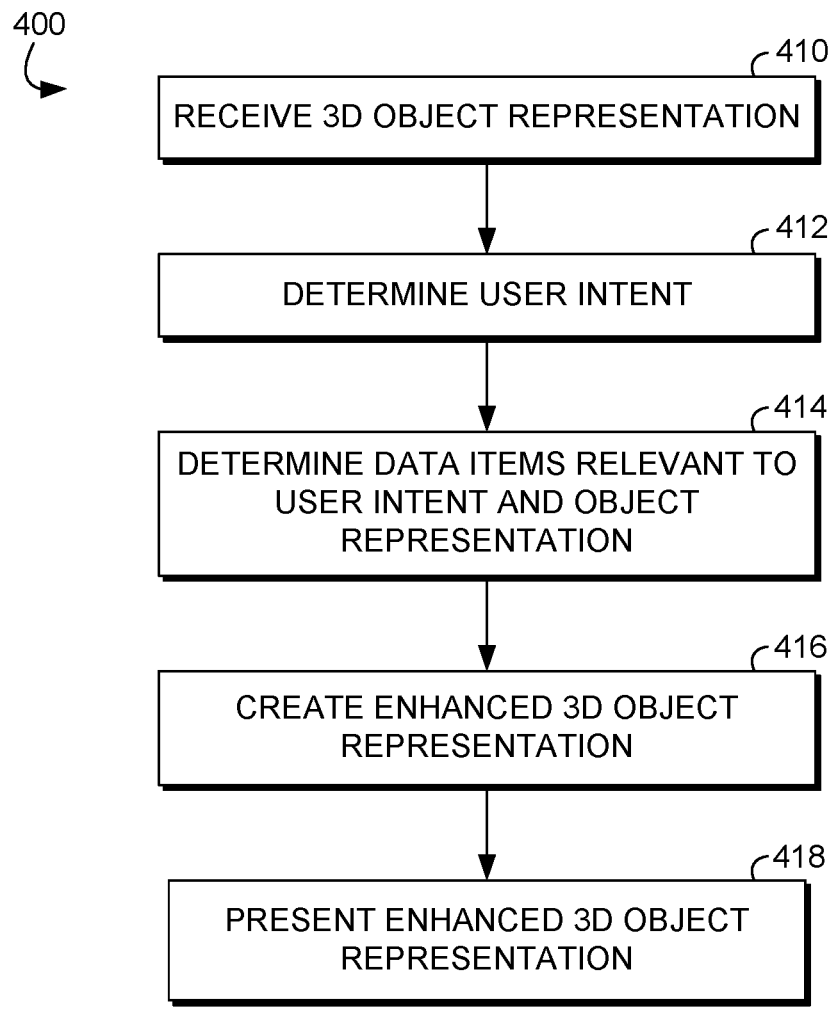
FIG. 4 is a flow diagram depicting another method for enhancing object representations using data items determined based upon inferred user intents, in accordance with an aspect of the technology described herein.

With reference to FIG. 4, a flow diagram is illustrated showing another exemplary method 400 for enhancing object representations using data items selected based upon inferred user intents. As indicated at block 410, a three-dimensional object representation is received, e.g., by the object representation receiving component 218 of the object representation engine 212 of FIG. 2. As indicated at block 412, an intent of a user is determined, for instance, using the user intent determining component 220 of the object representation engine 212 of FIG. 2. The user intent is related to the received three-dimensional object representation. As indicated at block 414, one or more data items relevant to the user intent and to the three-dimensional object representation are determined, for instance, using the data item determining component 222 of the object representation engine 212 of FIG. 2. As indicated at block 416, the three-dimensional object representation is enhanced with at least a portion of the one or more data items to create an enhanced three-dimensional object representation. This is accomplished, for instance, utilizing the object representation enhancing component 224 of the object representation engine 212 of FIG. 2. As indicated at block 418, the enhanced three-dimensional object representation is presented (e.g., displayed) to the user, e.g., utilizing the presenting component 226 of the object representation engine 212 of FIG. 2.

Exemplary Scenario

Figure 5:
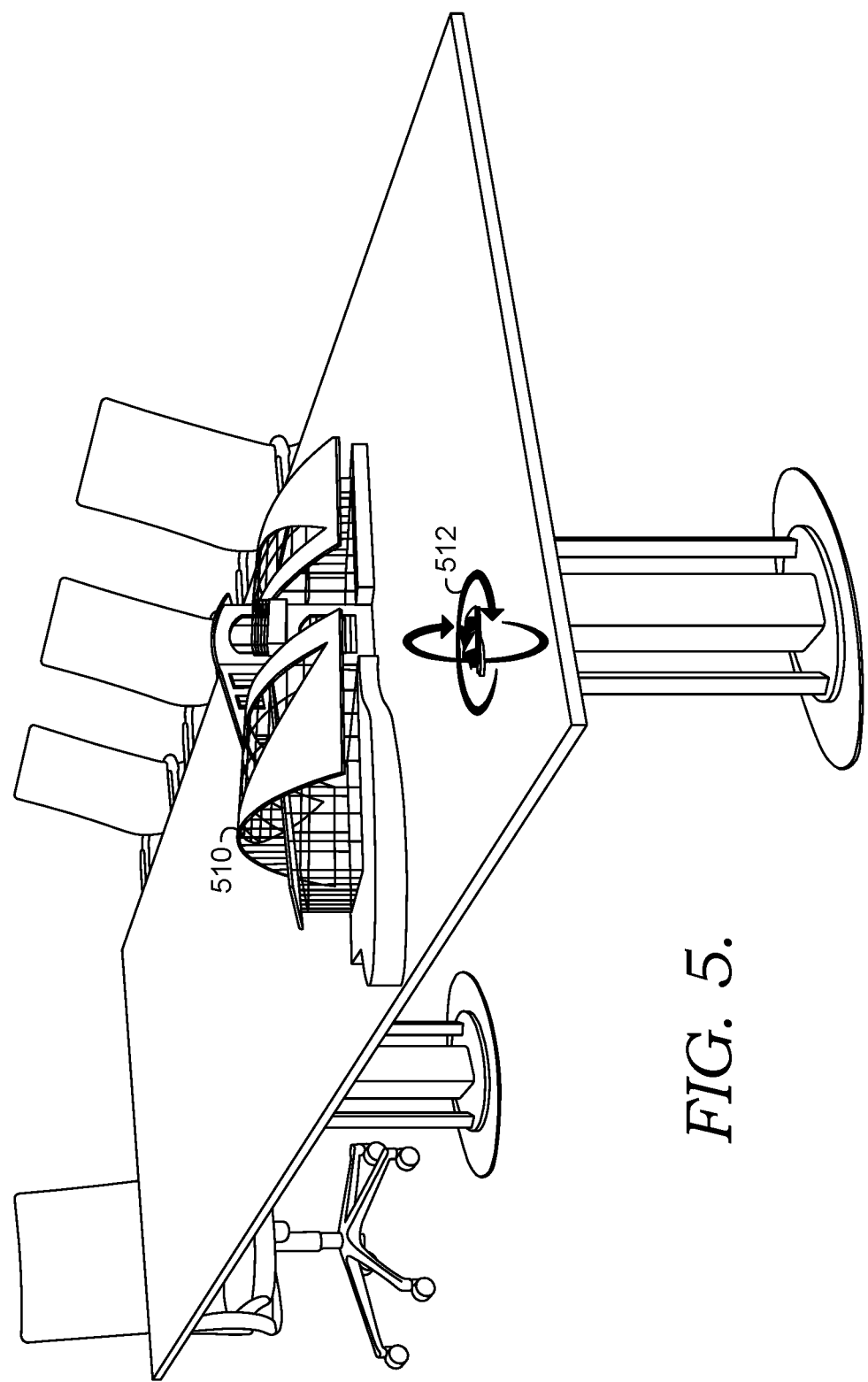
FIG. 5 is a schematic diagram depicting an exemplary initial object representation, in accordance with an aspect of the technology described herein.

Suppose an architect is in the process of creating a few design concepts for a client. Utilizing a system in accordance with aspects of the present technology, she creates (or receives/recalls from an existing file) a three-dimensional initial representation of a proposed building (i.e., object) and views the proposed initial object representation utilizing Microsoft Hololens® technology. Utilizing this technology, she is able to rotate, zoom in and out and manipulate the building in three dimensions and in real time. A schematic diagram illustrating an exemplary proposed building structure 510 and illustrating the manipulable nature 512 of the object representation is shown in FIG. 5.

Figure 6:
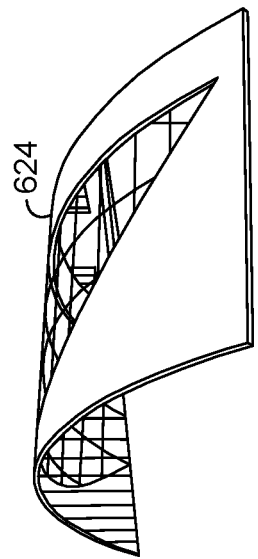
FIG. 6 is a schematic diagram depicting an exemplary collection of information indicative of user intent, an exemplary collection of data items determined based upon the various user intent indicators, and a proposed enhancement to the initial object representation of FIG. 5, in accordance with an aspect of the technology described herein.
Figure 6:
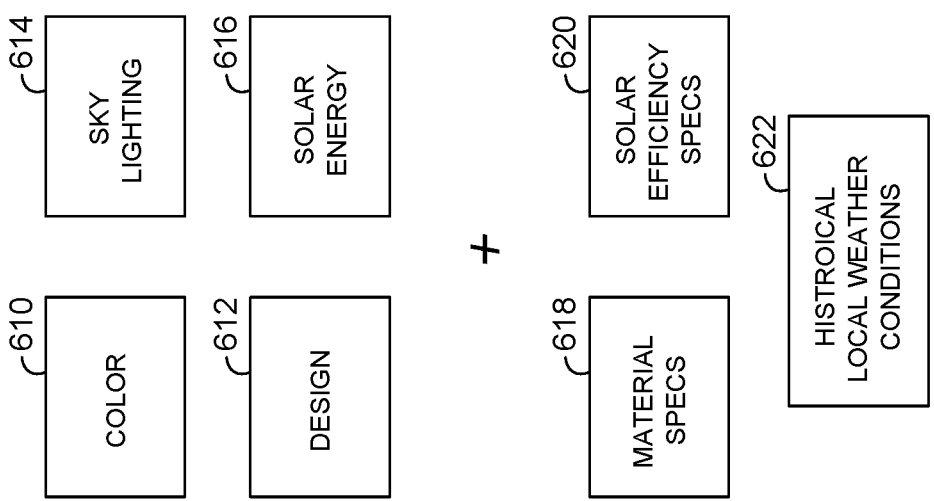

Early in the design process, the architect is in exploration mode and is researching and capturing a variety of examples of different elements that she is considering for the design. With reference to FIG. 6, a schematic diagram illustrating items she has posted to her office wall based on this exploration (e.g., a color palate 610, roof designs 612, sky lighting options 614, and solar energy options 616) is shown. Each of these posts is indicative of an intent of the architect-user with respect to the initial object representation (i.e., proposed building structure) that may be inferred.

In accordance with aspects of the present technology, the Microsoft Hololens® platform is integrated with the Microsoft Bing® platform (provided by Microsoft® Corporation of Redmond Wash.) such that search-related data collected and maintained within the Bing® platform is accessible for enhancing the initial object representation. Accordingly, the search-related data is mined and data items relevant to the object representation and to the user intent(s) are determined. As illustrated, such data items include material specifications 618, solar efficiency specifications 620, and historical local weather conditions 622. Note that the historical local weather conditions 622 indicates that information signaling a user intent related to location has been accessible to the system.

The information indicative of user intent (e.g., color palate 610, roof designs 612, sky lighting options 614, solar energy options 616, and location information), and the coincident determined data items (e.g., material specifications 618, solar efficiency specifications 620, and historical local weather conditions 622) are utilized to create an enhanced roof structure 624 that the system in accordance with aspects hereof has determined appropriate given all the information available to it.

Figure 7:
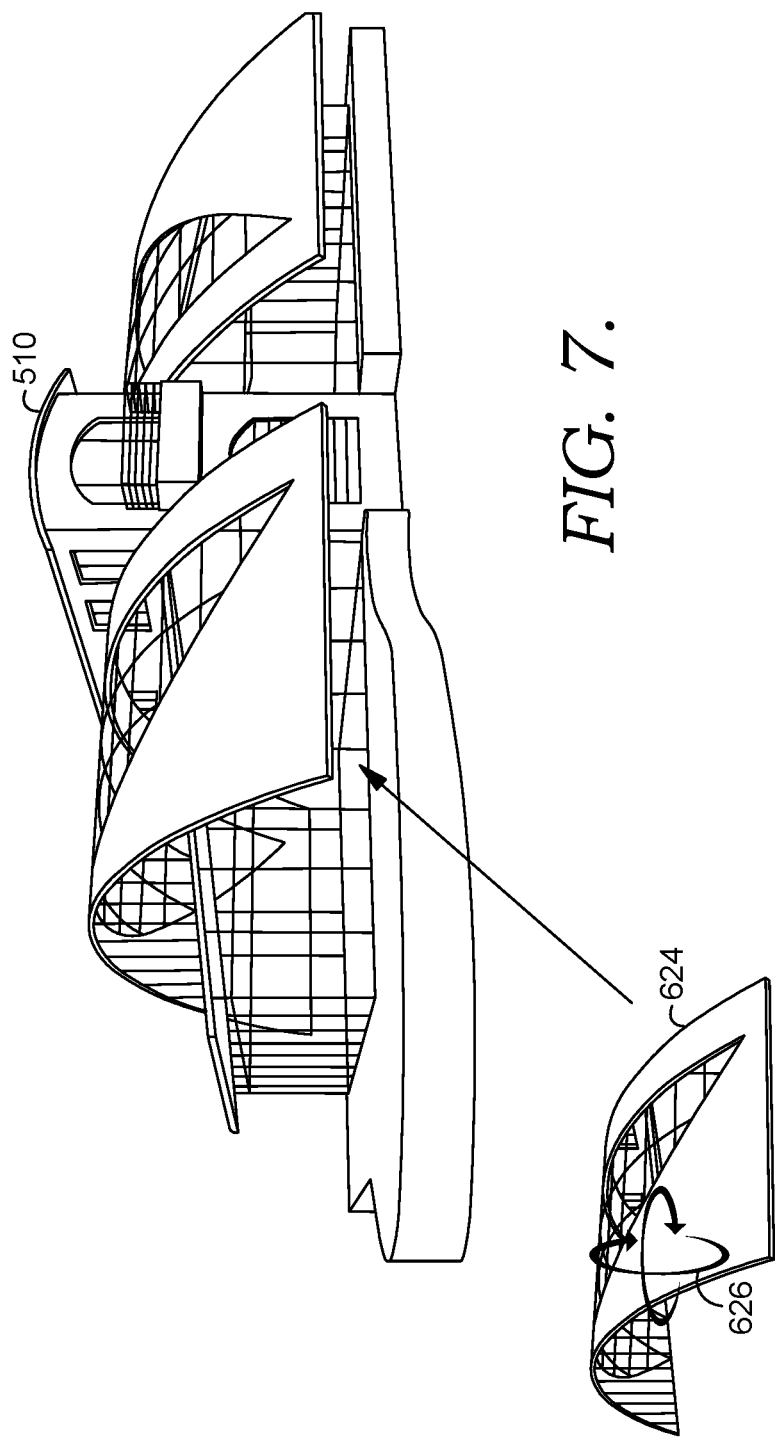
FIG. 7 is a schematic diagram depicting an exemplary proposed design enhancement alongside an initial object representation, in accordance with an aspect of the technology described herein.
Figure 8:
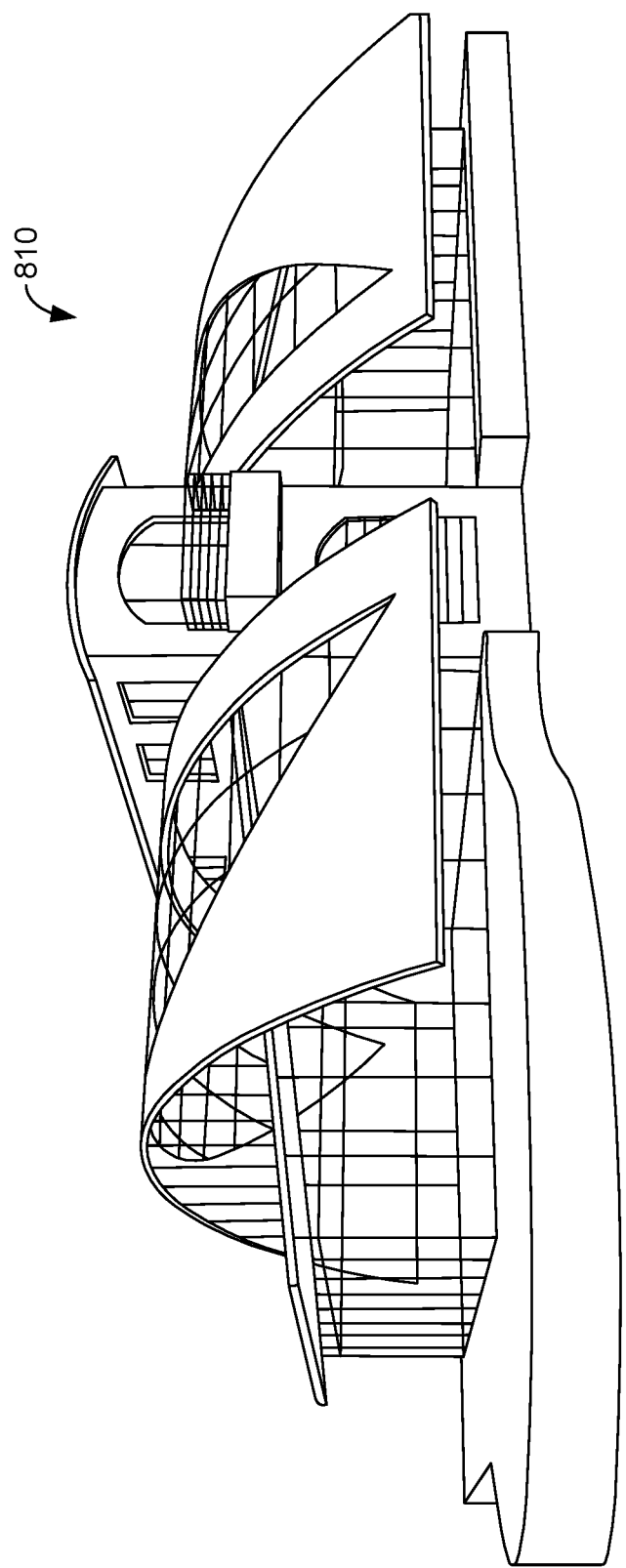
FIG. 8 is a schematic diagram depicting an exemplary enhanced object representation, in accordance with an aspect of the technology described herein.

As shown in FIG. 7, the enhanced roof structure 624 may be manipulated 626 (rotated, zoomed in and out of, etc.) and may be applied to the initial object representation (i.e., proposed building structure), to create an enhanced building structure 810 (FIG. 8). In embodiments, the enhanced roof structure 624 may automatically be mapped to the proposed building structure 510. In other embodiments, the architect-user may be presented with an option to apply the suggested enhanced roof structure 624 to the proposed building structure 510 by taking affirmative action. Any and all such variations, and any combination thereof, are contemplated to be within the scope of embodiments hereof.

Some of the determined data items (e.g., material specifications 618, solar efficiency specifications 620, etc.) consist of information rather than visual characteristics that may be applied to the initial object representation. At its initial stages, the initial object representation (i.e., proposed building structure) is basically a wireframe—devoid of meaningful information being attached thereto. In accordance with aspects of the present technology, information (e.g., material specifications 618, solar efficiency specifications 620, etc.) may be tagged or otherwise attached to the object representation in creating the enhanced object representation. As such, this information, though not altering of the visual characteristics of the model, enhances the model since the object representation now includes information relevant to construction of an actual structure from the representation.

Figure 9:
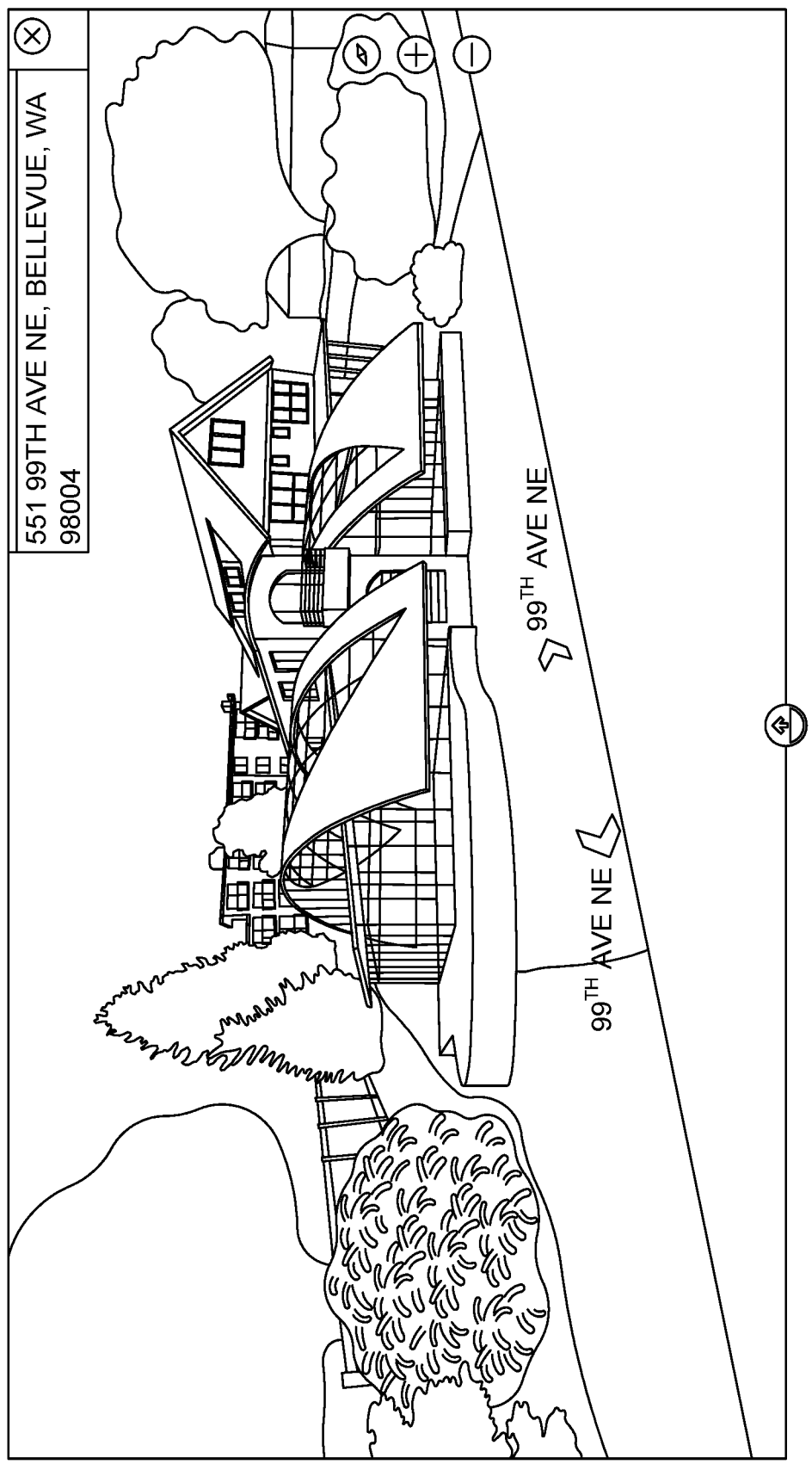
FIG. 9 is a schematic diagram depicting another exemplary enhanced object representation, in accordance with an aspect of the technology described herein.

As shown in FIG. 9, the previously-referred to location information may also be utilized to show the user what the proposed building structure (enhanced or initial) may look like when placed in its intended environment. Additional information, such as power line placement, drainage concerns, and the like, may additionally be taken into account by the system in suggesting enhancements to the proposed structure.

Figure 10:
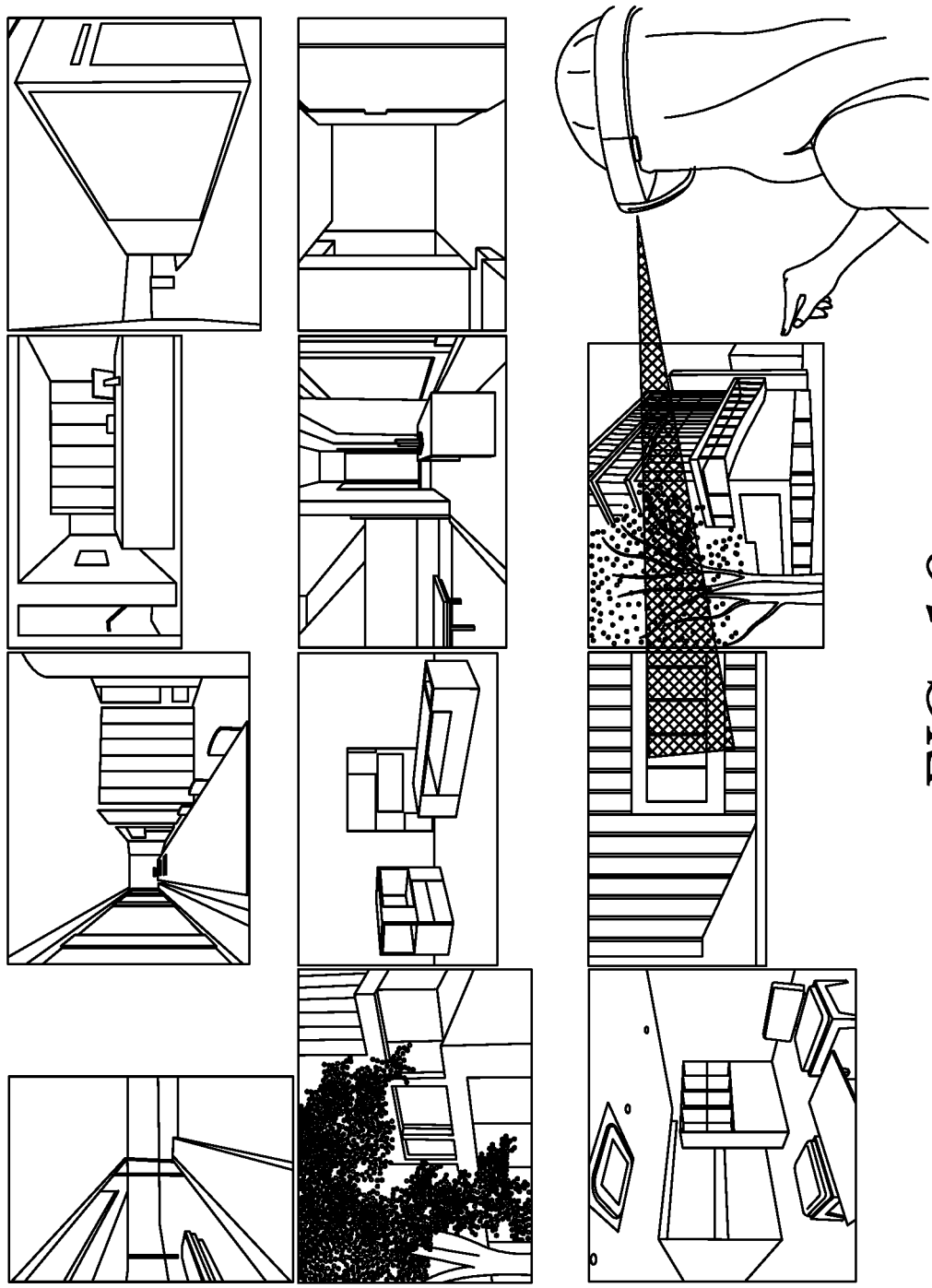
FIGS. 10 and 11 are schematic diagrams depicting additional artifacts indicative of user intent, in accordance with aspects of the technology described herein.
Figure 11:
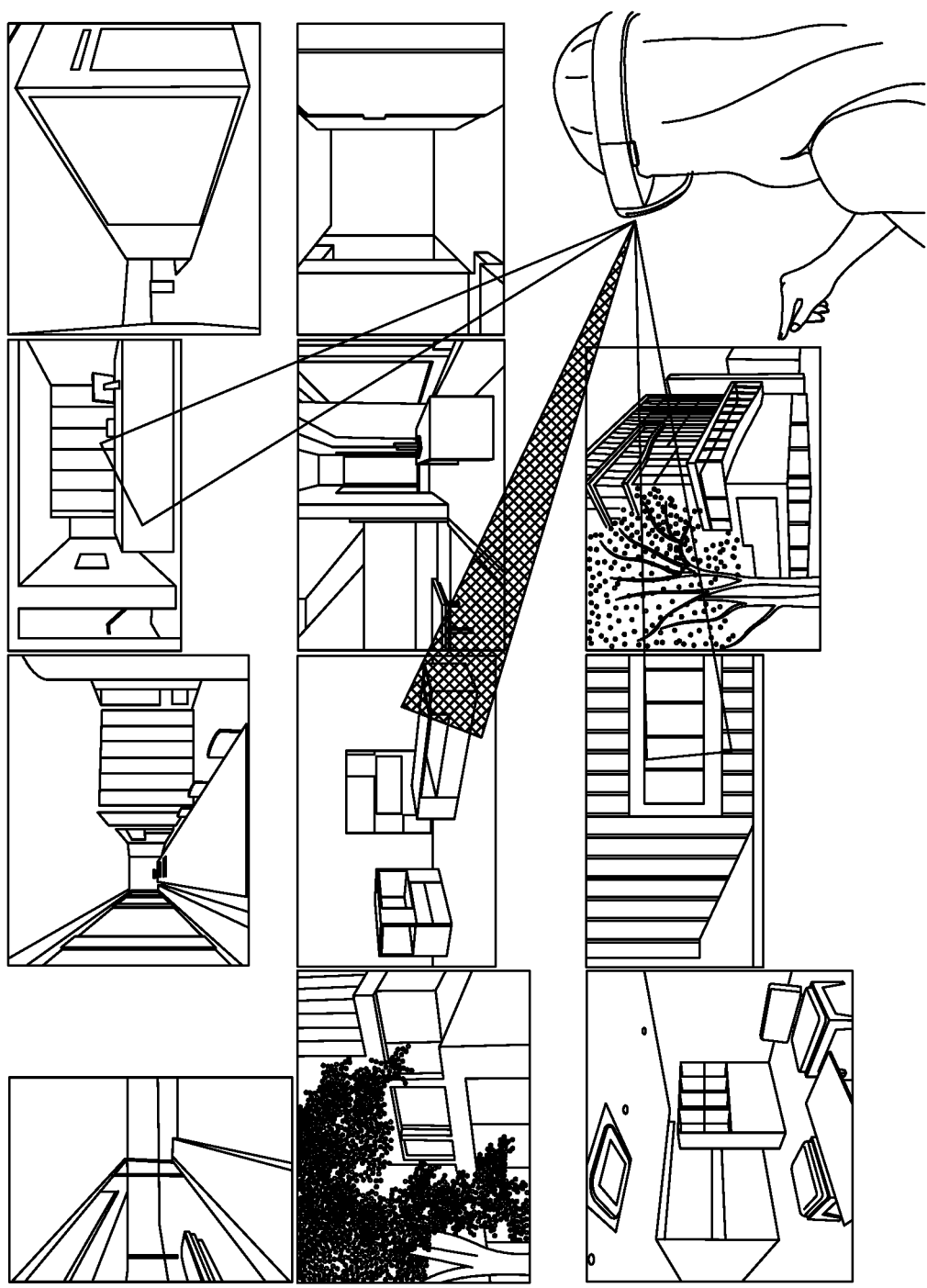

FIGS. 10 and 11 illustrate additional ways in which the architect-user's intent may be inferred with respect to the proposed building structure 510. Each image in FIG. 10 represents an image that the architect-user has viewed. The culmination of the number of images viewed, as well as the time spent lingering on particular features (as shown) may indicate that the architect-user prefers a rectangular window design for the proposed building structure 510. Linger time on the furniture items (see FIG. 11) also may indicate that the architect-user prefers a particular type of furniture for the proposed building structure 510. Though not items posted to the architect-user's office wall as in the previous instances, such artifacts are nonetheless indicative of intent and may be utilized in determining data items for use in enhancing the proposed building structure 510.

It will be understood and appreciated by those having ordinary skill in the art that this scenario description is merely exemplary and is not meant to limit the scope of embodiments of the subject technology in any way. The scenario is offered merely to enhance the reader's understanding of various aspects that may be incorporated into systems and methods in accordance with the technology described herein.

EMBODIMENTS

Embodiment 1

A computing device comprising: at least one processor; and a computer storage memory having computer-executable instructions stored thereon which, when executed by the at least one processor, configure the computing device to: receive information indicative of an object representation; determine an intent of a user, the user intent being related to the object representation; determine one or more data items relevant to the user intent and to the object representation; and enhance the object representation with at least a portion of the one or more data items to create an enhanced object representation.

Embodiment 2

The computing device of embodiment 1, wherein the information indicative of the object representation is a three-dimensional object representation.

Embodiment 3

The computing device of embodiment 1, wherein the information indicative of the object representation is one of a two-dimensional object representation, a text-based object description, a gesture-based object description, and a combination thereof.

Embodiment 4

The computing device of any of embodiments 1, 2 or 3, wherein the user intent related to the object representation is determined utilizing one or more of: search query data, data items saved by the user, data items posted by the user, data items shared by the user, web sites or web pages visited by the user, a quantity of visits to a particular web site or web page by the user, linger time on a web site or web page by the user, linger time on a particular item by the user, user-stated preferences, user-inferred preferences, and prior user behavior.

Embodiment 5

The computing device of embodiment 4, wherein the search query data comprises one or more of search query content, search query session duration, a quantity of repeat search queries, and a quantity of related search queries.

Embodiment 6

The computing device of any of the above embodiments, wherein at least one of the one or more data items relevant to the user intent and to the object representation is determined by mining search-query-related data.

Embodiment 7

The computing device of any of the above embodiments, wherein the enhanced object representation is a three-dimensional object representation.

Embodiment 8

The computing device of any of the above embodiments, wherein the processor further configures the computing device to suggest at least one enhancement and receive a user selection of the at least one enhancement prior to creating the enhanced object representation.

Embodiment 9

A method of enhancing object representations using inferred user intents, the method comprising: receiving a three-dimensional object representation; determining an intent of a user, the user intent being related to the three-dimensional object representation; determining one or more data items relevant to the user intent and to the three-dimensional object representation; enhancing the three-dimensional object representation with at least a portion of the one or more data items to create an enhanced three-dimensional object representation; and presenting the enhanced three-dimensional object representation.

Embodiment 10

The method of embodiment 9, wherein the user intent related to the three-dimensional object representation is determined utilizing one or more of: search query data, data items saved by the user, data items posted by the user, data items shared by the user, a web site or web page visited by the user, a quantity of visits to a web site or web page by the user, linger time on a web site or web page by the user, linger time on a particular item by the user, user-stated preferences, user-inferred preferences, and prior user behavior.

Embodiment 11

The method of embodiment 10, wherein the search query data comprises one or more of search query content, search query session duration, a quantity of repeat search queries, and a quantity of related search queries.

Embodiment 12

The method of any of embodiments 9, 10 or 11, wherein at least one of the one or more data items relevant to the user intent and to the three-dimensional object representation is determined by mining search-query-related data.

Embodiment 13

The method of any of embodiments 9, 10, 11, or 12, further comprising: suggesting at least one enhancement; and receiving a user selection of the at least one enhancement prior to creating the enhanced three-dimensional object representation.

Embodiment 14

One or more computer storage media having computer-executable instructions embodied thereon, that when executed, configure a computing device to perform a method of enhancing object representations using inferred user intents, the method comprising: receiving information indicative of an object representation; inferring an intent of a user related to the object representation; determining one or more data items relevant to the user intent and to the object representation; and creating an enhanced object representation utilizing at least a portion of the one or more data items.

Embodiment 15

The one or more computer storage media of embodiment 14, wherein the information indicative of the object representation is a three-dimensional object representation.

Embodiment 16

The one or more computer storage media of embodiment 14, wherein the information indicative of the object representation is one of a two-dimensional object representation, a text-based object description, a gesture-based object description, and a combination thereof.

Embodiment 17

The one or more computer storage media of any of embodiments 14, 15 or 16, wherein the user intent related to the object representation is determined utilizing one or more of: search query data, data items saved by the user, data items posted by the user, data items shared by the user, web sites or web pages visited by the user, a quantity of visits to a particular web site or web page by the user, linger time on a web site or web page by the user, linger time on a particular item by the user, user-stated preferences, user-inferred preferences, and prior user behavior

Embodiment 18

The one or more computer storage media of embodiment 17, wherein the search query data comprises one or more of search query content, search query session duration, a quantity of repeat search queries, and a quantity of related search queries.

Embodiment 19

The one or more computer storage media of any of embodiments 14 through 18, wherein at least one of the one or more data items relevant to the user intent and to the object representation is determined by mining search-query-related data.

Embodiment 20

The one or more computer storage media of any of embodiments 14 through 19, wherein the enhanced object representation is a three-dimensional object representation.

As used herein, the terminology "any of embodiments" or similar variations of said terminology is intended to be interpreted such that features of embodiments may be combined in any combination. For example, an exemplary embodiment 4 may indicate the method/apparatus of any of embodiments 1 through 3, which is intended to be interpreted such that features of embodiment 1 and embodiment 4 may be combined, elements of embodiment 2 and embodiment 4 may be combined, elements of embodiments 3 and 4 may be combined, elements of embodiments 1, 2, and 4 may be combined, elements of embodiments 2, 3, and 4 may be combined, elements of embodiments 1, 2, 3, and 4 may be combined, and/or other variations. Further, the terminology "any of embodiments" or similar variations of said terminology is intended to include "any one of embodiments" or other variations of such terminology, as indicated by some of the examples provided above.

While specific elements and steps are discussed in connection to one another, it is understood that any element and/or steps provided herein is contemplated as being combinable with any other elements and/or steps regardless of explicit provision of the same while still being within the scope provided herein. Since many possible aspects may be made of the disclosure without departing from the scope thereof, it is to be understood that all matter herein set forth or shown in the accompanying drawings is to be interpreted as illustrative and not in a limiting sense.

The technology claimed is:

1. A computing device comprising:
   at least one processor; and
   a computer storage memory having computer-executable instructions stored thereon which, when executed by the at least one processor, configure the computing device to:
   receive information indicative of an object representation;
   determine an intent of a user comprising an enhancement that the user likely intends to apply to the object representation, wherein the intent is inferred at least in part based on search-related data determined from previous user activities;
   access a data store of stored data items to determine one or more data items that are relevant to both the inferred intent and the object representation; and
   prior to a potential attempt by the user to apply the enhancement to the object representation, automatically apply the enhancement to the object representation with at least a portion of the one or more data items to create an enhanced object representation, wherein applying the enhancement to the object representation comprises incorporating the at least a portion of the one or more data items into the object representation.

2. The computing device of claim 1, wherein the information indicative of the object representation is a three-dimensional object representation.

3. The computing device of claim 1, wherein the information indicative of the object representation is one of a two-dimensional object representation, a text-based object description, a gesture-based object description, and a combination thereof.

4. The computing device of claim 1, wherein the user intent is further determined utilizing at least one selected from the following: search query data, data items saved by the user, data items posted by the user, web sites or web pages visited by the user, a quantity of visits to a particular web site or web page by the user, linger time on a web site or web page by the user, linger time on a particular item by the user, user-stated preferences, user-inferred preferences, and prior user behavior.

5. The computing device of claim 4, wherein the search query data comprises at least one selected from the following: search query content, search query session duration, a quantity of repeat search queries, and a quantity of related search queries.

6. The computing device of claim 1, wherein at least one of the one or more data items relevant to the user intent and to the object representation is determined by mining search-query-related data.

7. The computing device of claim 1, wherein the enhanced object representation is a three-dimensional object representation.

8. The computing device of claim 1, wherein the processor further configures the computing device to suggest at least one enhancement and receive a user selection of the at least one enhancement prior to creating the enhanced object representation.

9. A method of enhancing object representations using inferred user intents, the method comprising:
receiving a three-dimensional object representation;
determining an intent of a user comprising an enhancement that the user likely intends to apply to the three-dimensional object representation, wherein the intent is determined at least in part based on one or more artifacts related to previous online activities of the user;
accessing a data store of stored data items to determine one or more data items relevant to the user intent and to the three-dimensional object representation;
prior to a potential attempt by the user to apply the enhancement to the three-dimensional object representation, automatically applying the enhancement to the three-dimensional object representation with at least a portion of the one or more data items to create an enhanced three-dimensional object representation, wherein applying the enhancement to the three-dimensional object representation comprises incorporating the at least a portion of the one or more data items into the three-dimensional object representation; and
presenting the enhanced three-dimensional object representation.

10. The method of claim 9, wherein the user intent is further determined utilizing at least one selected from the following: search query data, data items saved by the user, data items posted by the user, a web site or web page visited by the user, a quantity of visits to a web site or web page by the user, linger time on a web site or web page by the user, linger time on a particular item by the user, user-stated preferences, user-inferred preferences, prior user behavior, and collaborative information from a previous social interaction of the user with one or more other users.

11. The method of claim 10, wherein the search query data comprises at least one selected from the following: search query content, search query session duration, a quantity of repeat search queries, and a quantity of related search queries.

12. The method of claim 9, wherein at least one of the one or more data items relevant to the user intent and to the three-dimensional object representation is determined by mining search-query-related data.

13. The method of claim 9, further comprising:
suggesting at least one enhancement; and
receiving a user selection of the at least one enhancement prior to creating the enhanced three-dimensional object representation.

14. One or more computer storage media having computer-executable instructions embodied thereon, that when executed, configure a computing device to perform a method of enhancing object representations using inferred user intents, the method comprising:
receiving information indicative of an object representation;
inferring an intent of a user comprising an enhancement that the user likely intends to apply to the object representation, wherein the intent is inferred at least in part based on one or more image viewed by the user during previous user activity;
accessing a data store of stored data items to determine one or more data items relevant to the user intent and to the object representation; and
prior to a potential attempt by the user to apply the enhancement to the object representation, automatically applying the enhancement to create an enhanced object representation utilizing the object representation and at least a portion of the one or more data items, wherein creating the enhanced object representation comprises incorporating the at least a portion of the one or more data items into the object representation.

15. The one or more computer storage media of claim 14, wherein the information indicative of the object representation is a three-dimensional object representation.

16. The one or more computer storage media of claim 14, wherein the information indicative of the object representation is one of a two-dimensional object representation, a text-based object description, a gesture-based object description, and a combination thereof.

17. The one or more computer storage media of claim 14, wherein the user intent is further determined utilizing at least one selected from the following: search query data, data items saved by the user, data items posted by the user, web sites or web pages visited by the user, a quantity of visits to a particular web site or web page by the user, linger time on a web site or web page by the user, linger time on a particular item by the user, user-stated preferences, user-inferred preferences, and prior user behavior.

18. The one or more computer storage media of claim 17, wherein the search query data comprises at least one selected from the following: search query content, search query session duration, a quantity of repeat search queries, and a quantity of related search queries.

19. The one or more computer storage media of claim 14, wherein at least one of the one or more data items relevant to the user intent and to the object representation is determined by mining search-query-related data.

20. The one or more computer storage media of claim 14, wherein the enhanced object representation is a three-dimensional object representation.

* * * * *